(12) United States Patent
Lin

(10) Patent No.: US 7,291,921 B2
(45) Date of Patent: Nov. 6, 2007

(54) STRUCTURE OF A MICRO ELECTRO MECHANICAL SYSTEM AND THE MANUFACTURING METHOD THEREOF

(75) Inventor: Wen-Jian Lin, Hsinchu (TW)

(73) Assignee: Qualcomm Mems Technologies, Inc., San Diego, CA (US)

( * ) Notice: Subject to any disclaimer, the term of this patent is extended or adjusted under 35 U.S.C. 154(b) by 1207 days.

(21) Appl. No.: 10/810,660

(22) Filed: Mar. 29, 2004

(65) Prior Publication Data

US 2005/0078348 A1 Apr. 14, 2005

(30) Foreign Application Priority Data

Sep. 30, 2003 (TW) ............................ 92127100 A

(51) Int. Cl.
*H01L 29/40* (2006.01)
(52) U.S. Cl. .................. 257/773; 257/80; 257/415; 438/69; 359/254; 359/245; 359/291
(58) Field of Classification Search ................ 257/678, 257/773, 415, 80; 438/52, 69; 359/254, 359/245, 291
See application file for complete search history.

(56) References Cited

U.S. PATENT DOCUMENTS

| | | | |
|---|---|---|---|
| 2,534,846 A | 12/1950 | Ambrose et al. | |
| 3,439,973 A | 4/1969 | Paul et al. | |
| 3,443,854 A | 5/1969 | Weiss | |
| 3,616,312 A | 10/1971 | McGriff et al. | |
| 3,653,741 A | 4/1972 | Marks | |
| 3,656,836 A | 4/1972 | de Cremoux et al. | |
| 3,725,868 A | 4/1973 | Malmer, Jr. et al. | |
| 3,813,265 A | 5/1974 | Marks | |
| 3,955,880 A | 5/1976 | Lierke | |
| 4,099,854 A | 7/1978 | Decker et al. | |
| 4,196,396 A | 4/1980 | Smith | |
| 4,228,437 A | 10/1980 | Shelton | |
| 4,377,324 A | 3/1983 | Durand et al. | |
| 4,389,096 A | 6/1983 | Hori et al. | |
| 4,392,711 A | 7/1983 | Moraw et al. | |
| 4,403,248 A | 9/1983 | te Velde | |

(Continued)

FOREIGN PATENT DOCUMENTS

CH 681 047 12/1992

(Continued)

OTHER PUBLICATIONS

Akasaka, "Three-Dimensional IC Trends," Proceedings of IEEE, vol. 74, No. 12, pp. 1703-1714, (Dec. 1986).

(Continued)

*Primary Examiner*—Matthew Smith
*Assistant Examiner*—Jarrett J Stark
(74) *Attorney, Agent, or Firm*—Knobbe, Martens, Olson & Bear, LLP

(57) ABSTRACT

A structure of a micro electro mechanical system and a manufacturing method are provided, the structure and manufacturing method is adapted for an optical interference display cell. The structure of the optical interference display cell includes a first electrode, a second electrode and posts. The second electrode comprises a conductive layer covered by a material layer and is arranged about parallel with the first electrode. The support is located between the first plate and the second plate and a cavity is formed. In the release etch process of manufacturing the structure, the material layer protects the conductive layer from the damage by an etching reagent. The material layer also protects the conductive layer from the damage from the oxygen and moisture in the air.

39 Claims, 7 Drawing Sheets

U.S. PATENT DOCUMENTS

| | | |
|---|---|---|
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Katagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zayhowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A * | 3/1996 | Goossen et al. ............ 359/290 |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |
| 5,619,365 A | 4/1997 | Rhoades et al. |
| 5,619,366 A | 4/1997 | Rhoads et al. |
| 5,622,814 A | 4/1997 | Miyata et al. |
| 5,629,790 A | 5/1997 | Neukermans et al. |

| Patent No. | Kind | Date | Inventor(s) |
|---|---|---|---|
| 5,633,652 | A | 5/1997 | Kanbe et al. |
| 5,636,052 | A | 6/1997 | Arney et al. |
| 5,636,185 | A | 6/1997 | Brewer et al. |
| 5,638,084 | A | 6/1997 | Kalt |
| 5,638,946 | A | 6/1997 | Zavracky |
| 5,641,391 | A | 6/1997 | Hunter et al. |
| 5,646,768 | A | 7/1997 | Kaeriyama |
| 5,647,819 | A | 7/1997 | Fujita et al. |
| 5,650,834 | A | 7/1997 | Nakagawa et al. |
| 5,650,881 | A | 7/1997 | Hornbeck |
| 5,654,741 | A | 8/1997 | Sampsell et al. |
| 5,657,099 | A | 8/1997 | Doherty et al. |
| 5,659,374 | A | 8/1997 | Gale, Jr. et al. |
| 5,665,997 | A | 9/1997 | Weaver et al. |
| 5,673,139 | A | 9/1997 | Johnson |
| 5,674,757 | A | 10/1997 | Kim |
| 5,683,591 | A | 11/1997 | Offenberg |
| 5,703,710 | A | 12/1997 | Brinkman et al. |
| 5,706,022 | A | 1/1998 | Hato |
| 5,710,656 | A | 1/1998 | Goosen |
| 5,726,480 | A | 3/1998 | Pister |
| 5,739,945 | A | 4/1998 | Tayebati |
| 5,745,193 | A | 4/1998 | Urbanus et al. |
| 5,745,281 | A | 4/1998 | Yi et al. |
| 5,771,116 | A | 6/1998 | Miller et al. |
| 5,784,190 | A | 7/1998 | Worley |
| 5,784,212 | A | 7/1998 | Hornbeck |
| 5,793,504 | A | 8/1998 | Stoll |
| 5,808,780 | A | 9/1998 | McDonald |
| 5,818,095 | A | 10/1998 | Sampsell |
| 5,822,170 | A | 10/1998 | Cabuz et al. |
| 5,824,608 | A * | 10/1998 | Gotoh et al. ................ 438/745 |
| 5,825,528 | A | 10/1998 | Goossen |
| 5,835,255 | A | 11/1998 | Miles |
| 5,838,484 | A | 11/1998 | Goossen et al. |
| 5,842,088 | A | 11/1998 | Thompson |
| 5,867,302 | A | 2/1999 | Fleming et al. |
| 5,912,758 | A | 6/1999 | Knipe et al. |
| 5,943,158 | A | 8/1999 | Ford et al. |
| 5,959,763 | A | 9/1999 | Bozler et al. |
| 5,972,193 | A | 10/1999 | Chou et al. |
| 5,976,902 | A | 11/1999 | Shih |
| 5,986,796 | A | 11/1999 | Miles |
| 6,016,693 | A | 1/2000 | Viani et al. |
| 6,028,690 | A | 2/2000 | Carter et al. |
| 6,038,056 | A | 3/2000 | Florence et al. |
| 6,040,937 | A | 3/2000 | Miles |
| 6,049,317 | A | 4/2000 | Thompson et al. |
| 6,055,090 | A | 4/2000 | Miles |
| 6,057,903 | A | 5/2000 | Colgan et al. |
| 6,061,075 | A | 5/2000 | Nelson et al. |
| 6,099,132 | A | 8/2000 | Kaeriyama |
| 6,100,872 | A | 8/2000 | Aratani et al. |
| 6,113,239 | A | 9/2000 | Sampsell et al. |
| 6,115,326 | A | 9/2000 | Puma et al. |
| 6,147,790 | A | 11/2000 | Meier et al. |
| 6,158,156 | A | 12/2000 | Patrick |
| 6,160,833 | A | 12/2000 | Floyd et al. |
| 6,166,422 | A | 12/2000 | Qian et al. |
| 6,180,428 | B1 | 1/2001 | Peeters et al. |
| 6,194,323 | B1 | 2/2001 | Downey et al. |
| 6,195,196 | B1 | 2/2001 | Kimura et al. |
| 6,201,633 | B1 | 3/2001 | Peeters et al. |
| 6,204,080 | B1 | 3/2001 | Hwang |
| 6,232,936 | B1 | 5/2001 | Gove et al. |
| 6,243,149 | B1 | 6/2001 | Swanson et al. |
| 6,246,398 | B1 | 6/2001 | Koo |
| 6,249,039 | B1 | 6/2001 | Harvey et al. |
| 6,282,010 | B1 | 8/2001 | Sulzbach et al. |
| 6,284,560 | B1 | 9/2001 | Jech et al. |
| 6,295,154 | B1 | 9/2001 | Laor et al. |
| 6,323,982 | B1 | 11/2001 | Hornbeck |
| 6,327,071 | B1 | 12/2001 | Kimura et al. |
| 6,329,297 | B1 | 12/2001 | Balish et al. |
| 6,335,831 | B2 | 1/2002 | Kowarz et al. |
| 6,351,329 | B1 | 2/2002 | Greywal |
| 6,356,254 | B1 | 3/2002 | Kimura |
| 6,376,787 | B1 | 4/2002 | Martin et al. |
| 6,391,675 | B1 | 5/2002 | Ehmke et al. |
| 6,392,233 | B1 | 5/2002 | Channin et al. |
| 6,392,781 | B1 | 5/2002 | Kim et al. |
| 6,407,851 | B1 | 6/2002 | Islam et al. |
| 6,447,126 | B1 | 9/2002 | Hornbeck |
| 6,452,465 | B1 | 9/2002 | Brown et al. |
| 6,456,420 | B1 | 9/2002 | Goodwin-Johansson |
| 6,465,355 | B1 | 10/2002 | Horsley |
| 6,466,354 | B1 | 10/2002 | Gudeman |
| 6,466,358 | B2 | 10/2002 | Tew |
| 6,473,274 | B1 | 10/2002 | Maimone et al. |
| 6,480,177 | B2 | 11/2002 | Doherty et al. |
| 6,496,122 | B2 | 12/2002 | Sampsell |
| 6,513,911 | B1 | 2/2003 | Ozaki et al. |
| 6,522,801 | B1 | 2/2003 | Aksyuk et al. |
| 6,531,945 | B1 | 3/2003 | Ahn et al. |
| 6,537,427 | B1 | 3/2003 | Raina et al. |
| 6,545,335 | B1 | 4/2003 | Chua et al. |
| 6,548,908 | B2 | 4/2003 | Chua et al. |
| 6,549,338 | B1 | 4/2003 | Wolverton et al. |
| 6,552,840 | B2 | 4/2003 | Knipe |
| 6,574,033 | B1 | 6/2003 | Chui et al. |
| 6,577,785 | B1 | 6/2003 | Spahn et al. |
| 6,589,625 | B1 | 7/2003 | Kothari et al. |
| 6,600,201 | B2 | 7/2003 | Hartwell et al. |
| 6,606,175 | B1 | 8/2003 | Sampsell et al. |
| 6,608,268 | B1 | 8/2003 | Goldsmith |
| 6,610,440 | B1 | 8/2003 | LaFollette et al. |
| 6,625,047 | B2 | 9/2003 | Coleman, Jr. |
| 6,630,786 | B2 | 10/2003 | Cummings et al. |
| 6,632,698 | B2 | 10/2003 | Ives |
| 6,635,919 | B1 | 10/2003 | Melendez et al. |
| 6,642,913 | B1 | 11/2003 | Kimura et al. |
| 6,643,069 | B2 | 11/2003 | Dewald |
| 6,650,455 | B2 | 11/2003 | Miles |
| 6,657,832 | B2 | 12/2003 | Williams et al. |
| 6,666,561 | B1 | 12/2003 | Blakley |
| 6,674,562 | B1 | 1/2004 | Miles et al. |
| 6,674,563 | B1 | 1/2004 | Chui et al. |
| 6,680,792 | B2 | 1/2004 | Miles |
| 6,710,908 | B2 | 3/2004 | Miles et al. |
| 6,720,267 | B1 | 4/2004 | Chen et al. |
| 6,736,987 | B1 | 5/2004 | Cho |
| 6,741,377 | B2 | 5/2004 | Miles |
| 6,741,384 | B1 | 5/2004 | Martin et al. |
| 6,741,503 | B1 | 5/2004 | Farris et al. |
| 6,743,570 | B2 | 6/2004 | Harnett et al. |
| 6,747,785 | B2 | 6/2004 | Chen et al. |
| 6,747,800 | B1 | 6/2004 | Lin |
| 6,756,317 | B2 | 6/2004 | Sniegowski et al. |
| 6,760,146 | B2 * | 7/2004 | Ikeda et al. ................ 359/291 |
| 6,768,097 | B1 | 7/2004 | Viktorovitch et al. |
| 6,775,174 | B2 | 8/2004 | Huffman et al. |
| 6,778,155 | B2 | 8/2004 | Doherty et al. |
| 6,778,306 | B2 | 8/2004 | Sniegowski et al. |
| 6,794,119 | B2 | 9/2004 | Miles |
| 6,811,267 | B1 | 11/2004 | Allen et al. |
| 6,812,482 | B2 | 11/2004 | Fleming et al. |
| 6,819,469 | B1 | 11/2004 | Koba |
| 6,822,628 | B2 | 11/2004 | Dunphy et al. |
| 6,829,132 | B2 | 12/2004 | Martin et al. |
| 6,838,304 | B2 * | 1/2005 | Ikeda et al. ................ 438/52 |
| 6,853,129 | B1 | 2/2005 | Cummings et al. |
| 6,855,610 | B2 | 2/2005 | Tung et al. |
| 6,859,218 | B1 | 2/2005 | Luman et al. |
| 6,861,277 | B1 | 3/2005 | Monroe et al. |
| 6,862,022 | B2 | 3/2005 | Slupe |
| 6,862,029 | B1 | 3/2005 | D'Souza et al. |

| | | |
|---|---|---|
| 6,867,896 B2 | 3/2005 | Miles |
| 6,870,581 B2 | 3/2005 | Li et al. |
| 6,870,654 B2 | 3/2005 | Lin et al. |
| 6,882,458 B2 | 4/2005 | Lin et al. |
| 6,882,461 B1 | 4/2005 | Tsai et al. |
| 6,905,621 B2 | 6/2005 | Ho et al. |
| 6,912,022 B2 | 6/2005 | Lin et al. |
| 6,946,315 B2 * | 9/2005 | Ikeda et al. .................... 438/52 |
| 6,952,303 B2 | 10/2005 | Lin et al. |
| 6,952,304 B2 | 10/2005 | Mushika et al. |
| 6,958,847 B2 | 10/2005 | Lin |
| 6,980,350 B2 | 12/2005 | Hung et al. |
| 6,982,820 B2 | 1/2006 | Tsai |
| 6,995,890 B2 | 2/2006 | Lin |
| 6,999,225 B2 | 2/2006 | Lin |
| 6,999,236 B2 | 2/2006 | Lin |
| 7,016,099 B2 * | 3/2006 | Ikeda et al. .................. 359/291 |
| 7,102,808 B2 * | 9/2006 | Kasai ......................... 359/290 |
| 7,116,462 B2 * | 10/2006 | Ikeda ......................... 359/291 |
| 2001/0003487 A1 | 6/2001 | Miles |
| 2001/0026951 A1 | 10/2001 | Vergani et al. |
| 2001/0040649 A1 | 11/2001 | Ozaki |
| 2001/0040675 A1 | 11/2001 | True et al. |
| 2002/0015215 A1 | 2/2002 | Miles |
| 2002/0021485 A1 | 2/2002 | Pilossof |
| 2002/0024711 A1 | 2/2002 | Miles |
| 2002/0036304 A1 | 3/2002 | Ehmke et al. |
| 2002/0054424 A1 | 5/2002 | Miles |
| 2002/0055253 A1 | 5/2002 | Rudhard |
| 2002/0071169 A1 | 6/2002 | Bowers et al. |
| 2002/0075555 A1 | 6/2002 | Miles |
| 2002/0086455 A1 | 7/2002 | Franosch et al. |
| 2002/0126364 A1 | 9/2002 | Miles |
| 2002/0135857 A1 | 9/2002 | Fitzpatrick et al. |
| 2002/0137072 A1 | 9/2002 | Mirkin et al. |
| 2002/0149828 A1 | 10/2002 | Miles |
| 2002/0168136 A1 | 11/2002 | Atia et al. |
| 2003/0006468 A1 | 1/2003 | Ma et al. |
| 2003/0035197 A1 * | 2/2003 | Ikeda et al. .................. 359/295 |
| 2003/0043157 A1 | 3/2003 | Miles |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0090350 A1 | 5/2003 | Feng et al. |
| 2003/0112096 A1 | 6/2003 | Potter |
| 2003/0138213 A1 | 7/2003 | Jin et al. |
| 2003/0152872 A1 | 8/2003 | Miles |
| 2003/0201784 A1 | 10/2003 | Potter |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2003/0231373 A1 | 12/2003 | Kowarz et al. |
| 2004/0004592 A1 * | 1/2004 | Ikeda et al. ..................... 345/85 |
| 2004/0010115 A1 | 1/2004 | Sotzing |
| 2004/0027636 A1 | 2/2004 | Miles |
| 2004/0027701 A1 | 2/2004 | Ishikawa |
| 2004/0028849 A1 | 2/2004 | Stark et al. |
| 2004/0035821 A1 | 2/2004 | Doan et al. |
| 2004/0051929 A1 | 3/2004 | Sampsell et al. |
| 2004/0053434 A1 | 3/2004 | Bruner |
| 2004/0058531 A1 | 3/2004 | Miles et al. |
| 2004/0058532 A1 | 3/2004 | Miles et al. |
| 2004/0061543 A1 | 4/2004 | Nam et al. |
| 2004/0063322 A1 | 4/2004 | Yang |
| 2004/0076008 A1 * | 4/2004 | Ikeda ......................... 362/259 |
| 2004/0077119 A1 * | 4/2004 | Ikeda et al. .................... 438/52 |
| 2004/0080807 A1 | 4/2004 | Chen et al. |
| 2004/0080832 A1 | 4/2004 | Singh |
| 2004/0087086 A1 | 5/2004 | Lee |
| 2004/0100677 A1 | 5/2004 | Huibers et al. |
| 2004/0124073 A1 | 7/2004 | Pilans et al. |
| 2004/0125281 A1 | 7/2004 | Lin et al. |
| 2004/0125282 A1 | 7/2004 | Lin et al. |
| 2004/0125536 A1 | 7/2004 | Arney et al. |
| 2004/0136076 A1 | 7/2004 | Parviz |
| 2004/0145049 A1 | 7/2004 | McKinnell et al. |
| 2004/0145811 A1 | 7/2004 | Lin et al. |
| 2004/0147056 A1 | 7/2004 | McKinnell et al. |
| 2004/0147198 A1 | 7/2004 | Lin et al. |
| 2004/0148009 A1 | 7/2004 | Buzzard |
| 2004/0150869 A1 | 8/2004 | Kasai |
| 2004/0160143 A1 | 8/2004 | Shreeve et al. |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park |
| 2004/0191937 A1 | 9/2004 | Patel et al. |
| 2004/0207897 A1 | 10/2004 | Lin |
| 2004/0209192 A1 | 10/2004 | Lin et al. |
| 2004/0209195 A1 | 10/2004 | Lin |
| 2004/0212026 A1 | 10/2004 | Van Brocklin et al. |
| 2004/0217378 A1 | 11/2004 | Martin et al. |
| 2004/0217919 A1 | 11/2004 | Pichl et al. |
| 2004/0218251 A1 | 11/2004 | Piehl et al. |
| 2004/0218334 A1 | 11/2004 | Martin et al. |
| 2004/0218341 A1 | 11/2004 | Martin et al. |
| 2004/0227493 A1 | 11/2004 | Van Brocklin et al. |
| 2004/0240027 A1 | 12/2004 | Lin et al. |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0003667 A1 | 1/2005 | Lin et al. |
| 2005/0020089 A1 | 1/2005 | Shi et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0038950 A1 | 2/2005 | Adelmann |
| 2005/0042117 A1 | 2/2005 | Lin |
| 2005/0046922 A1 | 3/2005 | Lin et al. |
| 2005/0046948 A1 | 3/2005 | Lin |
| 2005/0057442 A1 | 3/2005 | Way |
| 2005/0068583 A1 | 3/2005 | Gutkowski et al. |
| 2005/0068605 A1 | 3/2005 | Tsai |
| 2005/0068606 A1 | 3/2005 | Tsai |
| 2005/0069209 A1 | 3/2005 | Damera-Venkata et al. |
| 2005/0078348 A1 | 4/2005 | Lin |
| 2005/0085000 A1 * | 4/2005 | Ikeda et al. .................... 438/53 |
| 2005/0168449 A1 | 8/2005 | Lin |
| 2005/0195462 A1 | 9/2005 | Lin |
| 2005/0195467 A1 | 9/2005 | Kothari et al. |
| 2005/0202649 A1 | 9/2005 | Hung et al. |
| 2006/0066932 A1 | 3/2006 | Chui |

FOREIGN PATENT DOCUMENTS

| | | |
|---|---|---|
| CN | 092109265 | 11/2003 |
| DE | 10228946 A1 | 1/2004 |
| EP | 0173808 | 3/1986 |
| EP | 0 667 548 A1 | 8/1995 |
| EP | 0 694 801 | 1/1996 |
| EP | 0 695 959 | 2/1996 |
| EP | 08788524A 2 | 11/1998 |
| EP | 1 197 778 | 4/2002 |
| EP | 1258860 A1 | 11/2002 |
| EP | 1 452 481 A | 9/2004 |
| JP | 05275401 A1 | 10/1993 |
| JP | 10500224 | 1/1998 |
| JP | 10-148644 | 6/1998 |
| JP | 10-267658 | 10/1998 |
| JP | 11211999 A | 8/1999 |
| JP | 11-243214 | 9/1999 |
| JP | 11243214 | 9/1999 |
| JP | 2000-40831 A | 2/2000 |

| | | |
|---|---|---|
| JP | 2002 062493 | 2/2002 |
| JP | 2002-270575 | 9/2002 |
| JP | 2002-355800 | 12/2002 |
| JP | 2003-21798 | 1/2003 |
| JP | 2003001598 A | 1/2003 |
| JP | 2004-102022 A | 4/2004 |
| JP | 2004106074 A | 4/2004 |
| JP | 2004-212656 | 7/2004 |
| JP | 2005051007 A | 2/2005 |
| KR | 2002-9270 | 10/1999 |
| KR | 2000-0033006 | 6/2000 |
| WO | WO92/10925 | 6/1992 |
| WO | WO95/30924 | 11/1995 |
| WO | WO9530924 | 11/1995 |
| WO | WO9717628 | 5/1997 |
| WO | WO9952006 A2 | 10/1999 |
| WO | WO9952006 A3 | 10/1999 |
| WO | WO0114248 | 3/2001 |
| WO | WO 02/24570 | 3/2002 |
| WO | WO2006/036542 | 4/2002 |
| WO | WO03007049 A1 | 1/2003 |
| WO | WO 03052506 | 6/2003 |
| WO | WO 03/069413 A | 8/2003 |
| WO | WO03069413 A1 | 8/2003 |
| WO | WO03073151 A1 | 9/2003 |
| WO | WO2004006003 A1 | 1/2004 |
| WO | WO2004026757 A2 | 4/2004 |
| WO | WO 2005/019899 A1 | 3/2005 |
| WO | WO 2005/085932 A | 9/2005 |
| WO | WO 2006/036385 | 4/2006 |
| WO | WO 2006/036437 | 4/2006 |

OTHER PUBLICATIONS

Aratani K. et al., "Process and Design Considerations for Survace Micromachine Beams for a Tuneable Interferometer Array in Silicon," Proceedings of the Workshop on Micro Electro Mechanical Systems (MEMS) Fort Lauderale, Feb. 7-10, 1993, New York, IEEE, US, vol. Workshop 6, Feb. 7, 1993, pp. 230-235.
Aratani et al., "Surface micromachine tuneable interferometer array," Sensors and Actuators, pp. 17-23. (1994).
Conner, "Hybrid Color Display Using Optical Interference Filter Array," SID Digest, pp. 577-580 (1993).
Fan et al., "Channel Drop Filters in Photonic Crystals," Optics Express, vol. 3, No. 1 (1998).
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).
Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.
Gosch, "West Germany Grabs the Lead in X-Ray Lithography," Electronics pp. 78-80 (Feb. 5, 1987).
Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.
Howard et al., "Nanometer-Scale Fabrication Techniques," VLSI Electronics: Microstructure Science, vol. 5, pp. 145-153 and pp. 166-173 (1982).
Ibbotson et al., "Comparison of XeF2 and F-atom reactions with Si and SiO2," Applied Physics Letters, vol. 44, No. 12, pp. 1129-1131 (Jun. 1984).
Jackson "Classical Electrodynamics," John Wiley & Sons Inc., pp. 568-573. (date unknown).
Jerman et al., "A Miniature Fabry-Perot Interferometer with a Corrugated Silicon Diaphragm Support," (1988).
Joannopoulos et al., "Photonic Crystals: Molding the Flow of Light," Princeton University Press (1995).
Johnson, "Optical Scanners," Microwave Scanning Antennas, vol. 1, p. 251-261, (1964).
Kim et al., "Control of Optical Transmission Through Metals Perforated With Subwavelength Hole Arrays," Optic Letters, vol. 24, No. 4, pp. 256-257, (Feb. 1999).
Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).
Lee et al., "The Surface/Bulk Micromachining (SBM) Process: A New Method for Fabricating Released MEMS in Single Crystal Silicon", Journal of Microelectromechanical Systems, vol. 8, Issue 4, pp. 409-416, (Dec. 1999).
Light over Matter, Circle No. 36 (Jun. 1993).
Lin et al., "Free-Space Micromachined Optical Switches for Optical Networking," IEEE Journal of Selected Topics in Quantum Electronics, vol. 5, No. 1, pp. 4-9. (Jan./Feb. 1999).
Little et al., "Vertically Coupled Microring Resonator Channel Dropping Filter," IEEE Photonics Technology Letters, vol. 11, No. 2, (1999).
Magel, "Integrated Optic Devices Using Micromachined Metal Membranes," SPIE vol. 2686, 0-8194-2060-Mar. 1996.
Miles, Mark, W., "A New Reflective FPD Technology Using Interferometric Modulation," The Proceedings of the Society for Information Display (May 11-16, 1997).
Nagami et al., "Plastic Cell Architecture: Towards Reconfigurable Computing For General-Purpose," IEEE, 0-8186-8900-, pp. 68-77, (May 1998).
Newsbreaks, "Quantum-trench devices might operate at terahertz frequencies," Laser Focus World (May 1993).
Oliner et al., "Radiating Elements and Mutual Coupling," Microwave Scanning Antennas, vol. 2, pp. 131-141, (1966).
Raley et al., "A Fabry-Perot Microinterferometer for Visible Wavelengths," IEEE Solid-State Sensor and Actuator Workshop, Jun. 1992, Hilton Head, SC.
Schnakenberg et al., "TMAHW Etchants for Silicon Micromachining," 1991 International Conference on Solid State Sensors and Actuators-Digest of Technical Papers, pp. 815-818 (1991).
Sperger et al., "High Performance Patterned All-Dielectric Interference Colour Filter for Display Applications," SID Digest, pp. 81-83, (1994).
Sridharan et al. "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.
Stone, "Radiation and Optics, An Introduction to the Classical Theory," McGraw-Hill, pp. 340-343, (1963).
Walker et al., "Electron-beam-tunable Interference Filter Spatial Light Modulator," Optics Letters vol. 13, No. 5, pp. 345-347, (May 1988).
Williams et al., "Etch Rates for Micromachining Processing," Journal of Microelectromechanical Systems, vol. 5, No. 4, pp. 256-259 (Dec. 1996).
Winters et al., "The etching of silicon with XeF2 vapor. Applied Physics Letters," vol. 34, No. 1, pp. 70-73 (Jan. 1979).
Winton, "A novel way to capture solar energy," Chemical Week, (May 1985).
Wu, "Design of a Reflective Color LCD Using Optical Interference Reflectors," ASIA Display '95, pp. 929-931, (Oct. 1995).
Zhou et al., "Waveguide Panel Display Using Electromechanical Spatial Modulators" SID Digest, vol. XXIX, (1998).
RCO Pt Pub 157313, May 1, 1991, FSI International.
Austrian Search Report for EX72/2005 dated May 13, 2005
Austrian Search Report for EX81/2005 dated May 18, 2005.
Austrian Search Report for EX170/2005 dated Jul. 6, 2005.
Austrian Search Report for EX139/2005 dated Jul. 27, 2005.
Austrian Search Report for EX144/2005 dated Aug. 11, 2005.
Bains, "Digital Paper Display Technology Holds Promise For Portables," CommsDesign EE Times (2000).

Bass, Handbook of Optics, vol. 1, Fundamentals, Techniques, and Design, Second Edition, McGraw-Hill, inc. New York pp. 2.29/2.36 (1995).

Chu, et al. "Formation and Microstructures of Anodic Aluminoa Films from Aluminum Sputtered onglass Substrate" Journal of the Electrochemical Society, 149 (7) B321-B327 (2002).

Crouse, "Self-ordered pore structure of anodized aluminum on silicon and pattern transfer" Applied Physics Letters, vol. 76, No. 1, Jan. 3, 2000. pp. 49-51.

French, P.J. "Development of Surface Micromachining techniques compatable with on-chip electronics" Journal of Micromechanics and Microengineering vol. 6 No. 2, 197-211 XP 002360789 Jun. 1996 IOP Publishing.

Furneaux, et al. "The Formation of Controlled-porosity membranes from Anodically Oxidized Aluminum" Nature vo 337 Jan. 12, 1989, pp. 147-149.

Jerman J.H. et al., "Maniature Fabry-Perot Interferometers Micromachined in Silicon for Use in Optical Fiber WDM Systems," Transducers. San Francisco, Jun. 24-27, 1991, Proceedings of the Internatioal Conference on Solid State Sensors Andactuators, New Youk IEEE, US, vol. Conf. 6, Jun. 24, 1991.

Lieberman, "MEMS Display Looks to Give PDAs Sharper Image," EE Times (Feb. 11, 1997).

Lieberman, "Microbridges at Heart of New MEMS Displays," EE Times (Apr. 24, 1997).

Maboudian, et al. Critical Review, Adhesion in Surface Micromechanical Structures: J. Vac. Sci Techno. B 15(1) Jan./Feb. 1997, pp. 1-20.

Microchem, LOR Lift-Off Resists Datasheet, 2002.

Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).

Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).

Penta Vacuum MEMS Etcher Specifications, http://www.pentavacuum.com/memes.htm.

Science and Technology, The Economist, pp. 89-90, (May 1999).

Search Report PCT/US05/030033 and Written Opinion.

Search Report PCT/US05/030902.

Search Report and Written Opinion for PCT/US05/33558 (May 19, 2005).

Search Report PCT/US05/032331 (Apr. 7, 2006).

Search Report PCT/US05/032331 (Jan. 9, 2006).

Search Report and written opinion PCT/US05/032647.

Tayebi et al. "Reducing the Effects of adhesion and friction in microelectomechanical systesm (MEMS) through surface roughening: Comparision Between theory and experiments" http://jap.ajp.org/jap/copyright.isp Journal of applied Physics 98, 073528 (2005).

Thin Film Transistors- Materials and Processes -vol. 1 Amorphous Silicon Thin Film Transistors ed. Yue Kuo, Kluwer Academic Publishers, Boston (2004).

Xactix Xetch X Specifications, http://xactix.com/Xtech X3specs.htm. Jan. 5, 2005.

Xactix Xetch Production information.

* cited by examiner

STRUCTURE OF A MICRO ELECTRO MECHANICAL SYSTEM AND THE MANUFACTURING METHOD THEREOF

FIELD OF THE INVENTION

The present invention relates to a structure of an optical interference display cell and the manufacturing method thereof, and more particularly, to the structure of a movable electrode in an optical interference display cell and the manufacturing method.

BACKGROUND OF THE INVENTION

In a micro electro mechanical system (MEMS), the development of a sacrificial layer technique has become a key factor for manufacturing a suspended structure, such as a cantilever, a beam, a membrane, a channel, a cavity, a joint or hinge, a link, a crank, a gear or a rack, to name a few. A structure release etching process is adapted for removing a sacrificial layer, so a structure of a structure release in a micro electro mechanical system has a critical influence on the process of removing the sacrificial layer.

A conventional structure release etching process is first introduced with an optical interference display cell as an example. The optical interference display cell, a kind of a micro electro mechanical system, is used to fabricate a planar display. Planar displays are popular for portable displays and displays with space limits because they are light and small in size. To date, planar displays in addition to liquid crystal displays (LCD), organic electro-luminescent displays (OLED), plasma display panels (PDP), a mode of optical interference displays is another option for planar displays.

U.S. Pat. No. 5,835,255 discloses an array of display units of visible light that can be used in a planar display. Please refer to FIG. 1, which depicts a cross-sectional view of a display unit in the prior art. Every optical interference display unit 100 comprises two walls, 102 and 104. Posts 106 support these two walls 102 and 104, and a cavity 108 is subsequently formed. The distance between these two walls 102 and 104, that is, the length of the cavity 108, is D. One of the walls 102 and 104 is a hemi-transmissible/hemi-reflective layer with an absorption rate that partially absorbs visible light, and the other is a light reflective layer that is deformable when voltage is applied. When the incident light passes through the wall 102 or 104 and arrives in the cavity 108, in all visible light spectra, only the visible light with the wavelength corresponding to the formula 1.1 can generate a constructive interference and can be emitted, that is, $$2D=N\lambda \quad (1.1)$$

, where N is a natural number.

When the length D of cavity 108 is equal to half of the wavelength times any natural number, a constructive interference is generated and a sharp light wave is emitted. In the meantime, if the observer follows the direction of the incident light, a reflected light with wavelength λ1 can be observed. Therefore, the display unit 100 is "open".

FIG. 2 depicts a cross-sectional view of a display unit in the prior art after applying a voltage. As shown in FIG. 2, while driven by the voltage, the wall 104 is deformed and falls down towards the wall 102 due to the attraction of static electricity. At this time, the distance between wall 102 and 104, that is, the length of the cavity 108 is not exactly zero, but is d, which can be zero. If we use d instead of D in formula 1.1, only the visible light with a wavelength satisfying formula 1.1, which is λ2, can generate a constructive interference, and be reflected by the wall 104, and pass through the wall 102. Because wall 102 has a high light absorption rate for light with wavelength λ2, all the incident light in the visible light spectrum is filtered out and an observer who follows the direction of the incident light cannot observe any reflected light in the visible light spectrum. The display unit 100 is now "closed".

FIG. 3A to FIG. 3B illustrate a method for manufacturing a conventional display cell. Referring to FIG. 3A, a first electrode 110 and a sacrificial layer 111 are formed in sequence on a transparent substrate 109, and opening 112, which is suitable for forming a supporter therein, is formed in the first electrode 110 and the sacrificial layer 111. Then, a supporter 106 is formed in the opening 112. Next, an electrode 114 is formed on the sacrificial layer 111 and the supporter 106. Subsequently, referring to FIG. 3B, the sacrificial layer 111 shown in FIG. 3A is removed by a release etching process to form a cavity 116, which is located in the position of the sacrificial layer 111, and the length D of the cavity 116 is the thickness of the sacrificial layer 111.

In a micro electro mechanical process, a micro suspended structure is fabricated by using a sacrificial layer. A suspended movable microstructure is fabricated by a selective etching between a device structure layer and the sacrificial layer to remove the sacrificial layer and leave the structure layer, and this process is called a structure release etching. The difference between the structure release etching process and an IC process is that in the structure release etching process, the selective etching is an isotropic etching, so that an undercut or an under etching is formed in the structure layer for smooth separation of the structure layer and the substrate.

No matter the wet structure release process or the dry structure release process is used, the choices of the material of the sacrificial layer and the micro suspended structure should be restricted, that is, the material used should have high etching-selectivity in the etching process or else the goal of removing the sacrificial layer without etching the micro suspended structure can not be achieved. Therefore, it is impossible to use the same material in both sacrificial layer and the micro suspended structure in the present process.

In the process of the optical interference display cell, some materials, such as molybdenum, are very suitable to form the sacrificial layer and the movable electrodes. However, in the structure and the process of the conventional optical interference display cell, molybdenum cannot be the material of forming both sacrificial layer and the micro suspended structure at the same time. Thus results in enormous limits in choosing the materials.

Furthermore, the aforementioned movable electrode is generally a membrane that is usually metal. The thickness of the movable electrode is so small that the quality of the metal membrane is easily worsen because of the oxidation caused by the contact with air or moisture. Thus would affect the optical interference display cell. Accordingly, how to provide a new structure and the manufacturing method thereof of an optical interference display cell to broaden the choices of process materials and to protect the movable electrode from the oxidation caused by the air or moisture has become a very important issue.

SUMMARY OF THE INVENTION

Hence, an object of the present invention is to provide a structure of a micro electro mechanical system, suitable in an optical interference display cell, wherein the materials of the sacrificial layer and the suspended movable micro structure are not needed to restrict in the materials with high etching selectivity.

An alternative objective of the present invention is to provide a structure of a micro electro mechanical system, suitable in an optical interference display cell, wherein a protection layer is added between the sacrificial layer and the suspended movable micro structure and the materials of forming the protection layer and the sacrificial layer have high etching selectivity.

Another objective of the present invention is to provide a structure of a micro electro mechanical system, suitable in an optical interference display cell, wherein the materials of the sacrificial layer and the suspended movable microstructure are the same.

Still another objective of the present invention is to provide a structure of a micro electro mechanical system, suitable in an optical interference display cell, wherein the materials of the sacrificial layer and the suspended movable microstructure can be the materials with not-high etching selectivity.

Still another objective of the present invention is to provide a structure of a micro electro mechanical system, suitable in an optical interference display cell, wherein a protection layer covers the suspended movable microstructure and the materials of forming the protection layer and the sacrificial layer have high etching selectivity and will protect the suspended movable microstructure from the etching of the air and moisture.

Still another objective of the present invention is to provide a structure of a micro electro mechanical system suitable in an optical interference display cell and suitable to manufacture the structure of a micro electro mechanical system with the aforementioned protection layer.

According to the aforementioned objectives, in one preferred embodiment of the present invention, an optical interference display cell is taken as an example to explain how the present invention is used on the structure of a micro electro mechanical system. An optical interference display cell comprises a first electrode and a second electrode, and there are a supporter and a sacrificial layer therein, wherein the second electrode is movable. There is a protection layer between the second electrode and the sacrificial layer. The materials used in the sacrificial layer and the protection layer have high etching selectivity. There are no limits in choosing the materials used in the sacrificial layer and the second electrode, but the material of the second electrode needs to be a conductor.

In the process of removing the sacrificial layer through a structure release etch process, the etching plasma has high selectivity in the sacrificial layer and the protection layer, so only the sacrificial layer will be removed. Hence, there are no limits in choosing the materials used in the sacrificial layer and the second electrode.

According to the aforementioned objectives of the present invention, in another preferred embodiment of the present invention, another optical interference display cell is taken as an example that a protection layer is used to cover a suspended movable micro structure (a movable electrode). The materials of forming the protection layer and the sacrificial layer have high etching selectivity and will protect the suspended movable microstructure from the etching of the air and moisture. An optical interference display cell comprises a first electrode and a second electrode, and there are a supporter and a sacrificial layer therein, wherein the second electrode is movable. A protection layer covers the second electrode. The materials used in the sacrificial layer and the protection layer have high etching selectivity. There are no limits in choosing the materials used in the sacrificial layer and the second electrode, but the material of the second electrode needs to be a conductor.

In the process of removing the sacrificial layer through a structure release etch process, the etching plasma has high selectivity in the sacrificial layer and the protection layer, so only the sacrificial layer will be removed. Hence, there are no limits in choosing the materials used in the sacrificial layer and the second electrode. Besides, the protection layer covers the second electrode and keeps it from exposing to the air, and further avoids the second electrode from the damage of the oxygen and moisture in the air.

According to the structure of a micro electro mechanical system and the manufacturing method thereof disclosed in the present invention, the choosing of the materials used in the protection layer between the second electrode and the sacrificial layer are not restricted in the materials of high etching selectivity, and the protection layer covering or wrapping the second electrode will protect the second electrode from the damage of the oxygen and moisture in the air.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, where.

DETAILED DESCRIPTION OF THE PREFERRED EMBODIMENT

In order to make the illustration of a structure of a micro electro mechanical system and a method for manufacturing the same provided in the present invention more clear, an embodiment of the present invention herein takes an optical interference display cell structure and a manufacturing method thereof for example, to illustrate how to apply the structure of the structure release and the method for manufacturing the same disclosed in the present invention, and to further explain advantages of the present invention according to the disclosure of the embodiment.

The First Embodiment

Figure 1:
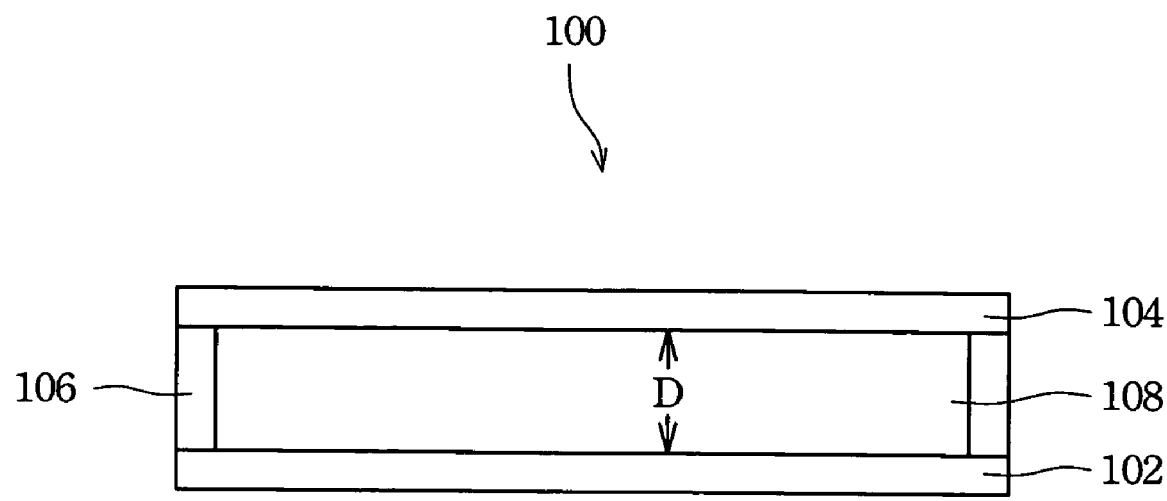
FIG. 1 illustrates a cross-sectional view of a conventional display cell.
Figure 2:
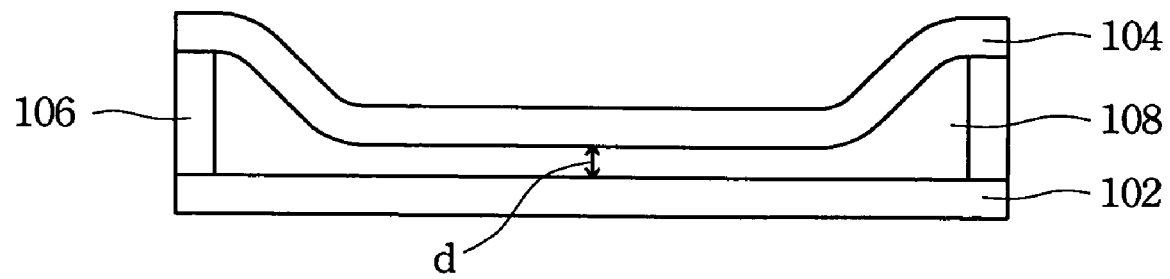
FIG. 2 illustrates a cross-sectional view of a conventional display cell after a voltage is applied.
Figure 3A:
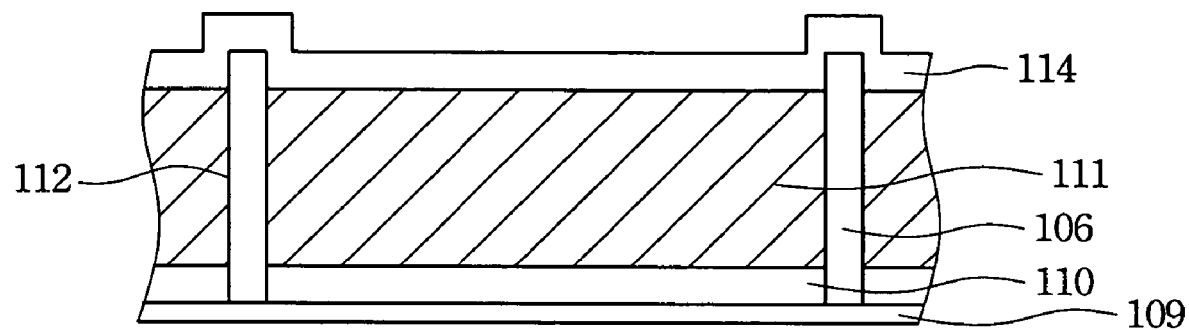
FIG. 3A to FIG. 3B illustrates a method for manufacturing a conventional display cell.
Figure 3B:
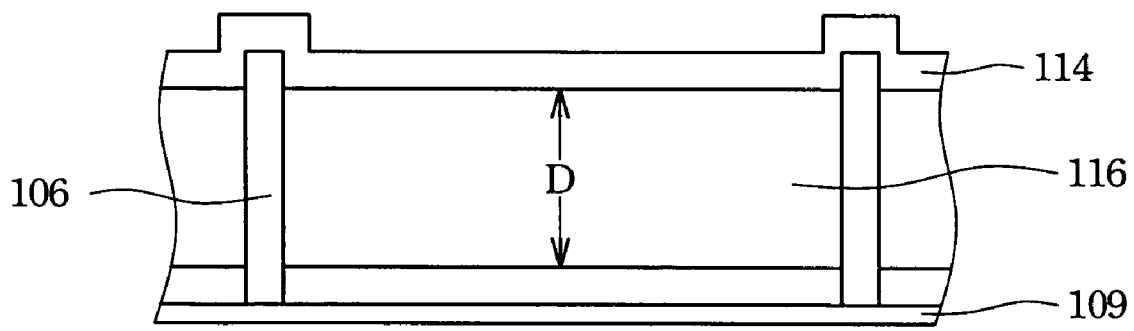
Figure 4A:
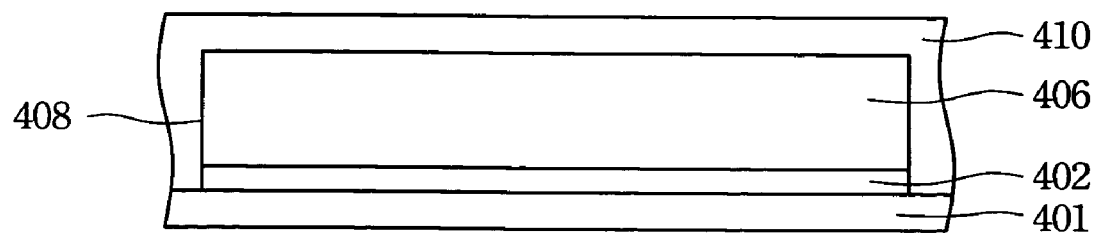
FIG. 4A to FIG. 4C illustrates a method for manufacturing an optical interference display cell structure in accordance with the first embodiment of the present invention.
Figure 4B:
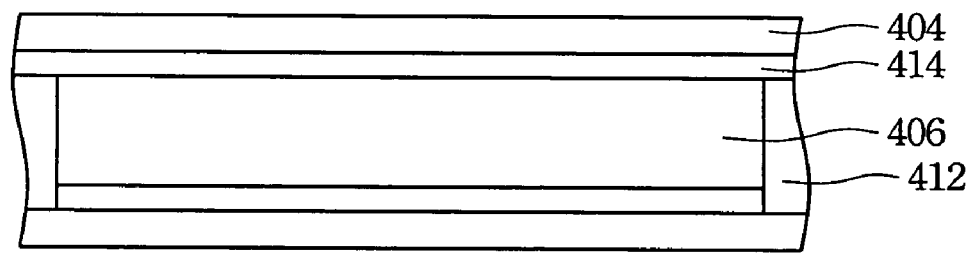
Figure 4C:
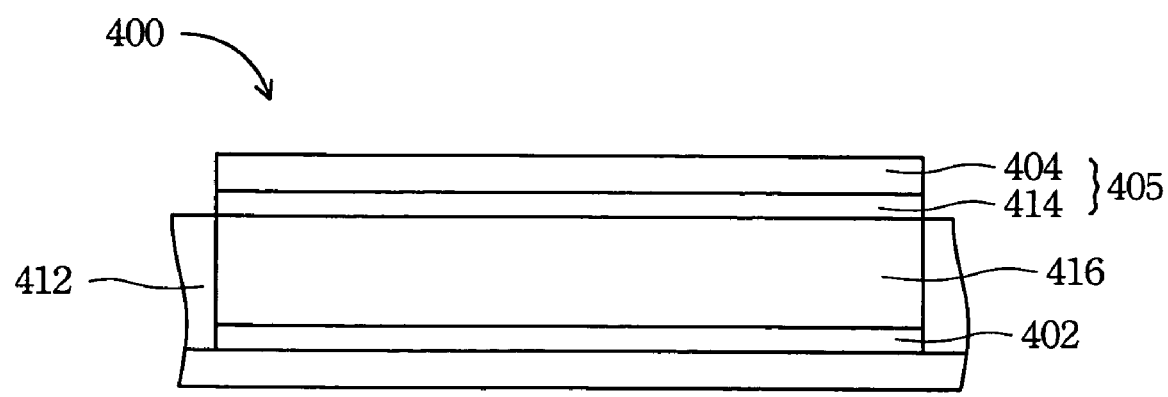

FIG. 4A to FIG. 4C illustrates a method for manufacturing an optical interference display cell structure in accordance with an embodiment of the present invention. Please referring to FIG. 4A, a first electrode 402 and a sacrificial layer 406 are formed on a transparent substrate 401 in sequence. The material of the sacrificial layer 406 can be transparent material, such as dielectric material, or opaque material, such as metal material. The opening 408, suitable for forming a supporter therein, is formed in the first electrode 402 and the sacrificial layer 406 by a photolithography process.

Then, a material layer 410 is formed on the sacrificial layer 406 to fill up the opening 408. The material layer 410 is suitable for forming the supporter, and the material layer 410 is generally made of photosensitive materials such as photoresists, or non-photosensitive polymer materials such as polyester, polyamide etc. If non-photosensitive materials are used for forming the material layer 410, a photolithographic etching process is required to define supporters in the material layer 410. In this embodiment, the photosensitive materials are used for forming the material layer 410, so merely a photolithography process is required for patterning the material layer 410. In the embodiment, the materials suitable for forming the material layer 410 comprise positive photoresists, negative photoresists, and all kinds of polymers, such as acrylic resins, epoxy resins etc.

Please referring to FIG. 4B, supporters 412 are defined by patterning the material layer 410 through a photolithography process. Next, a material layer 414 is formed on the sacrificial layer 406 and the supporters 412. Then, a conductor layer 404 is formed on the material layer 414. The materials used in the material layer 414 and the sacrificial layer 406 have high etching selectivity. While the sacrificial layer 406 uses metal material, the material layer 414 uses dielectric material, such as silicon oxide, silicon nitride, or transparent conductor material, such as indium tin oxide (ITO), indium zinc oxide (IZO), indium oxide (IO), or macromolecule polymer. While the sacrificial layer 406 uses silicon material, such as poly-silicon or amorphous silicon, the material layer 414 uses metal silicon oxide, or macromolecule polymer.

Please refer to FIG. 4C. The conductor layer 404 and the material layer 414 not yet covered by a photoresist layer (not shown in the drawing) is etched through a photolithography process and the second electrode 405 of every optical interference display cell is defined, wherein the second electrode 405 is movable. Finally, the sacrificial layer is removed through a structure release etch process, and a cavity 416 is formed. The material layer 414 is a protection layer. While the material of the material layer 414 is conductor material, it can also be the conductor part of the second electrode 405.

The optical interference display cell manufactured through the aforementioned process is illustrated in FIG. 4C. An optical interference display cell 400, which can be a color-changeable pixel unit, comprises a first electrode 402 and a second electrode 405, wherein the first electrode 402 and the second electrode 405 are set approximately in parallel. The first electrode 402 and the second electrode 405 are chosen from the group consisting of narrowband mirrors, broadband mirrors, non-metal mirrors, metal mirrors and any arbitrary combination thereof.

The supporters 412 support the first electrode 402 and the second electrode 405, and a cavity 416 is formed therein. The second electrode 405 comprises the conductor layer 404 and the material layer 414. The length of the cavity in the conventional optical interference display cell is the thick of the sacrificial layer, and the sacrificial layer is removed through a structure release process and then the cavity 416 is formed. In the embodiment, the material layer 414 of the second electrode 405 can protect the conductor layer 404 in the structure release process from the injury of the etching reagent. Therefore, when choosing the materials for the sacrificial layer and the second electrode, there is no need to restrict the material within the material with high etching selectivity. Hence, the chosen in materials is broader.

The Second Embodiment

FIG. 5A to FIG. 5D illustrate a method for manufacturing an optical interference display cell structure in accordance with an alternative embodiment of the present invention. Please referring to FIG. 5A, a first electrode 502 and a sacrificial layer 506 are formed on a transparent substrate 501 in sequence. The material of the sacrificial layer 506 can be transparent material, such as dielectric material, or opaque material, such as metal material. The opening 508, suitable for forming a supporter therein, is formed in the first electrode 502 and the sacrificial layer 506 by a photolithography process.

Then, a material layer 510 is formed on the sacrificial layer 506 to fill up the opening 508. The material layer 510 is suitable for forming the supporter, and the material layer is generally made of photosensitive materials such as photoresists, or non-photosensitive polymer materials such as polyester, polyamide etc. If non-photosensitive materials are used for forming the material layer, a photolithographic etching process is required to define supporters in the material layer 510. In this embodiment, the photosensitive materials are used for forming the material layer 510, so merely a photolithography process is required for patterning the material layer 510. In the embodiment, the materials suitable for forming the material layer 510 comprise positive photoresists, negative photoresists, and all kinds of polymers, such as acrylic resins, epoxy resins etc.

Figure 5A:
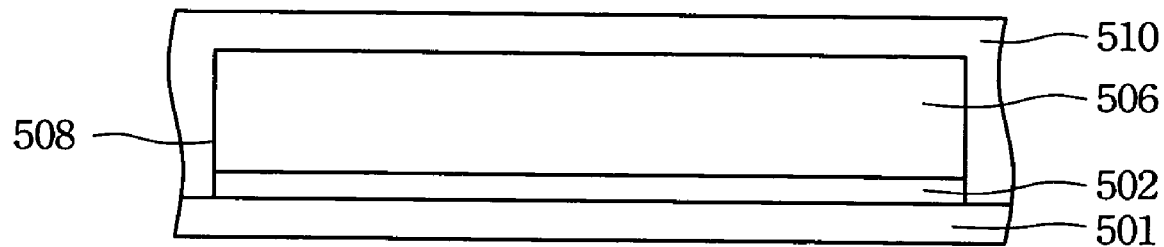
FIG. 5A to FIG. 5D illustrates a method for manufacturing an optical interference display cell structure in accordance with the second embodiment of the present invention; and FIG. 6A to FIG. 6D illustrates a method for manufacturing an optical interference display cell structure in accordance with the third embodiment of the present invention.
Figure 5B:
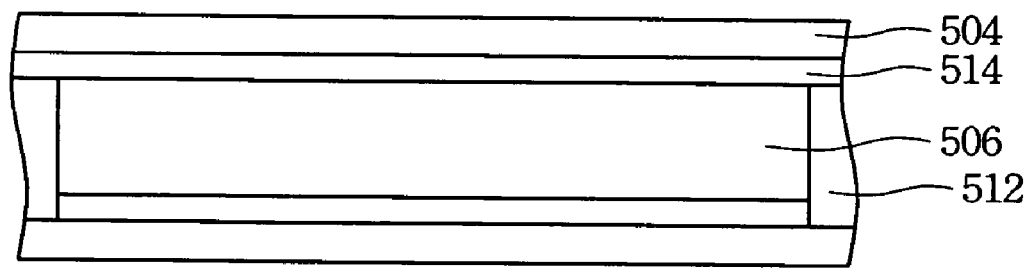

Please referring to FIG. 5B, supporters 512 are defined by patterning the material layer 510 through a photolithography process. Next, a material layer 514 is formed on the sacrificial layer 506 and the supporters 512. Then, a conductor layer 504 is formed on the material layer 514. The materials used in the material layer 514 and the sacrificial layer 506 have high etching selectivity. While the sacrificial layer 506 uses metal material, the material layer 514 uses dielectric material, such as silicon oxide, silicon nitride, or transparent conductor material, such as indium tin oxide (ITO), indium zinc oxide (IZO), indium oxide (IO), or macromolecule polymer. While the sacrificial layer 506 uses silicon material, such as poly-silicon or amorphous silicon, the material layer 514 uses metal silicon oxide, or macromolecule polymer.

Figure 5C:
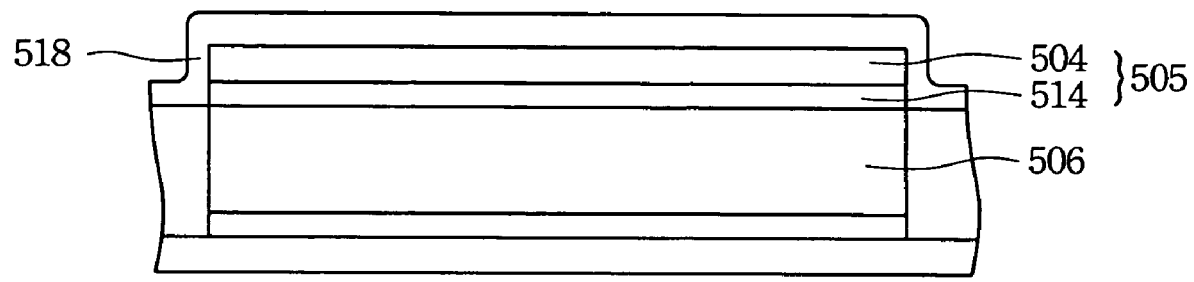

Please refer to FIG. 5C. The conductor layer 504 and the material layer 514 not yet covered by a photoresist layer (not shown in the drawing) is etched through a photolithography process and the second electrode 505 of every optical interference display cell is defined, wherein the second electrode 505 is movable. Next, a material layer 518 is formed to cover the second electrode 504. The material forming the material layer 518 is selected from the group comprising silicon material, dielectric material, transparent conductor, macromolecule polymer or metal oxide, wherein the silicon material can be poly-silicon or amorphous silicon, such as silicon oxide, silicon nitride, silicon oxynitride or transparent conductor material, such as indium tin oxide (ITO), indium zinc oxide (IZO), indium oxide (IO), or macromolecule polymer, such as paraffin or macromolecule material which can be coated by vapor. The material layer 514 and 518 are protection layers. While the materials of the material layer 514 and 518 are conductor material, they can also be the conductor parts of the second electrode 505.

Figure 5D:
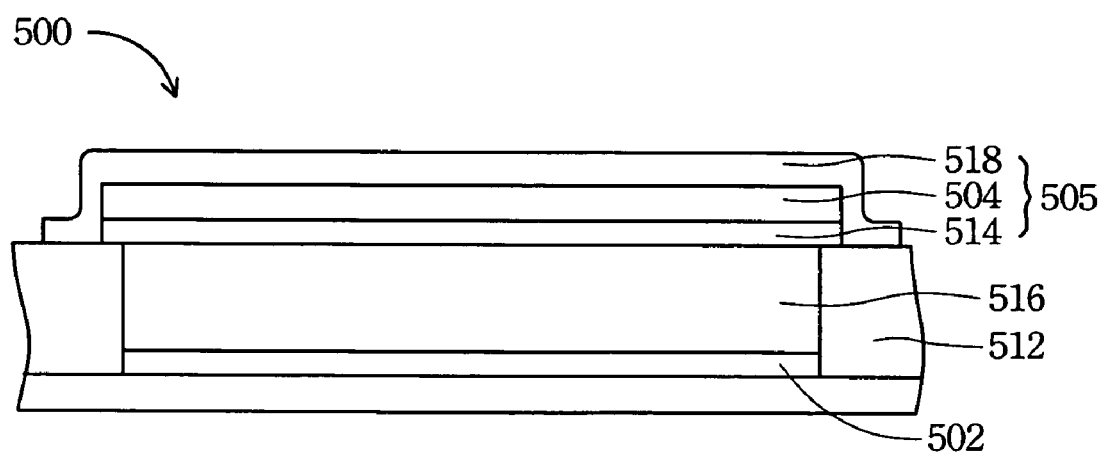

Please refer to FIG. 5D. Through a photolithography process, the material layer 518 is patterned and part of the material layer 518 on the supporters 512 is removed. It is to achieve the goal that the sacrificial layer 506 as shown in FIG. 5C can be laterally etching through the openings by the etching reagent in the following structure release etch process. Finally, the sacrificial layer is removed through the structure release etch process, and a cavity 516 is formed.

The optical interference display cell manufactured through the aforementioned process is illustrated in FIG. 5C. An optical interference display cell 500, which can be a color-changeable pixel unit, comprises a first electrode 502 and a second electrode 505, wherein the first electrode 502 and the second electrode 505 are set approximately in parallel. The first electrode 502 and the second electrode 505 are chosen from the group consisting of narrowband mirrors, broadband mirrors, non-metal mirrors, metal mirrors and any arbitrary combination thereof.

The supporters 512 support the first electrode 502 and the second electrode 505 and a cavity 516 is formed therein. The second electrode 505 comprises the conductor layer 504, the material layer 514 and the material layer 518, wherein the material layer 514 and the material layer 518 cover the conductor layer 504. The length of the cavity in the conventional optical interference display cell is the thick of the sacrificial layer, and the sacrificial layer is removed through a structure release process and then the cavity 516 is formed. In this embodiment, the material layer 518 and the material layer 514 of the conductor layer 504 of the second electrode 505 can protect the conductor layer 504 in the structure release process from the injury of the etching reagent. Therefore, when choosing the materials for the sacrificial layer and the second electrode, there is no need to restrict the material within the material with high etching selectivity. Hence, the chosen in materials is broader. Besides, the material layer 514 and the material layer 518 will further protect the conductor layer 504 from the oxidation and etching of the oxygen and the moisture in the air.

The Third Embodiment

FIG. 6A to FIG. 6D illustrate a method for manufacturing an optical interference display cell structure in accordance with another embodiment of the present invention. Please referring to FIG. 6A, a first electrode 602 and a sacrificial layer 606 are formed on a transparent substrate 601 in sequence. The material of the sacrificial layer 606 can be transparent material, such as dielectric material, or opaque material, such as metal material. The opening 608, suitable for forming a supporter therein, is formed in the first electrode 602 and the sacrificial layer 606 by a photolithography process.

Then, a material layer 610 is formed on the sacrificial layer 606 to fill up the opening 608. The material layer 610 is suitable for forming the supporter, and the material layer is generally made of photosensitive materials such as photoresists, or non-photosensitive polymer materials such as polyester, polyamide etc. If non-photosensitive materials are used for forming the material layer, a photolithographic etching process is required to define supporters in the material layer 610. In this embodiment, the photosensitive materials are used for forming the material layer 610, so merely a photolithography process is required for patterning the material layer 610. In the embodiment, the materials suitable for forming the material layer 610 comprise positive photoresists, negative photoresists, and all kinds of polymers, such as acrylic resins, epoxy resins etc.

Figure 6A:
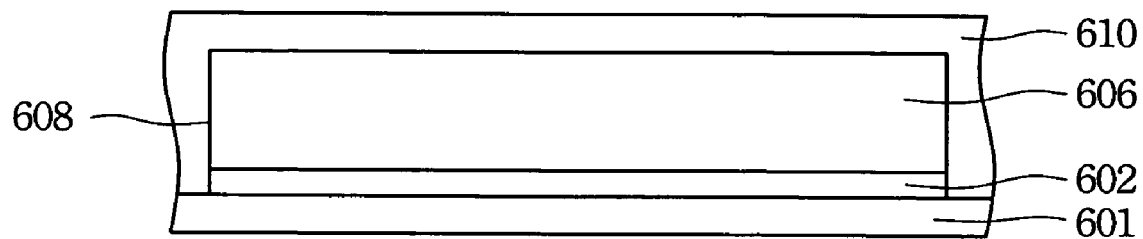
Figure 6B:
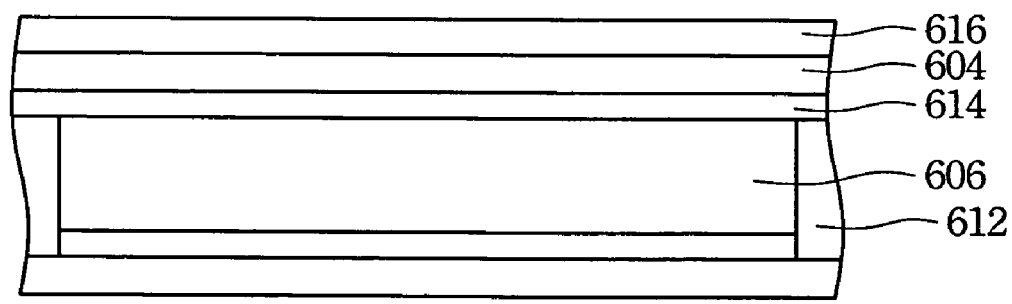

Please referring to FIG. 6B, supporters 612 are defined by patterning the material layer 610 through a photolithography process. Next, a material layer 614 is formed on the sacrificial layer 606 and the supporters 612. Then, a conductor layer 604 and a material layer 616 are formed in order on the material layer 614. The materials used in the material layer 614 and the material layer 616 and the material used in the sacrificial layer 606 have high etching selectivity. While the sacrificial layer 506 uses metal material, the material layer 614 and the material layer 616 use dielectric material, such as silicon oxide, silicon nitride, silicon oxynitride, or transparent conductor material, such as indium tin oxide (ITO), indium zinc oxide (IZO), indium oxide (IO), or macromolecule polymer, such as paraffin or macromolecule material which can be coated by vapor. While the sacrificial layer 606 uses silicon material, such as poly-silicon or amorphous silicon, the material layer 614 and the material layer 616 use metal silicon oxide, or macromolecule polymer.

Figure 6C:
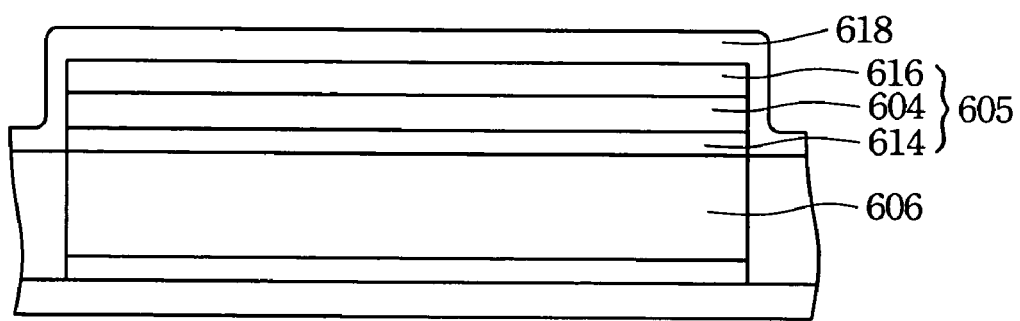

Please refer to FIG. 6C. The conductor layer 604, the material layer 614 and the material layer 616 not yet covered by a photoresist layer (not shown in the drawing) are etched through a photolithography process and the second electrode 605 of every optical interference display cell is defined, wherein the second electrode 605 is movable. Next, a material layer 618 is formed to cover the conductor layer 604, the material layer 614 and the material layer 616. The material forming the material layer 618 is selected from the group comprising silicon material, dielectric material, transparent conductor, macromolecule polymer or metal oxide, wherein the silicon material can be poly-silicon or amorphous silicon, such as silicon oxide, silicon nitride, silicon oxynitride or transparent conductor material, such as indium tin oxide (ITO), indium zinc oxide (IZO), indium oxide (IO), or macromolecule polymer, such as paraffin or macromolecule material which can be coated by vapor.

Figure 6D:
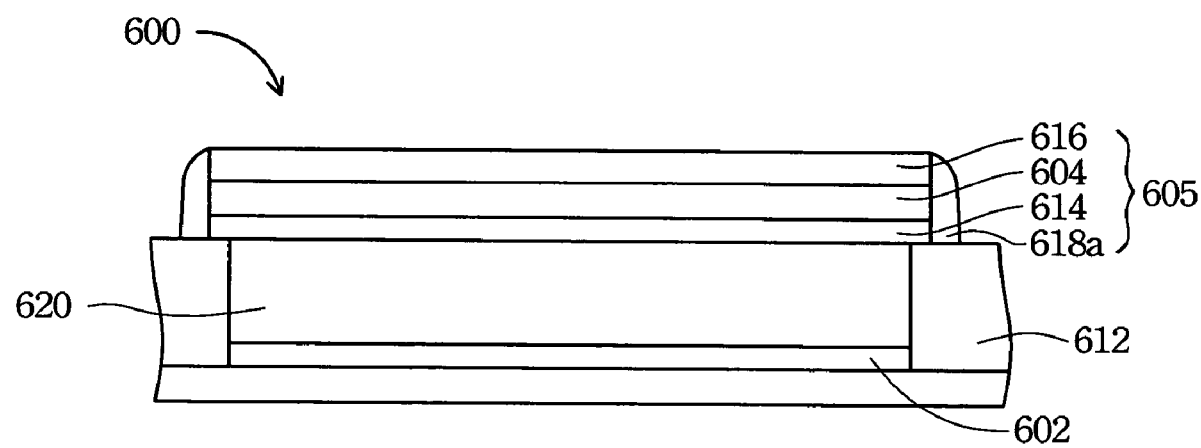

Please refer to FIG. 6D. The material layer 618 is etched through a self-aligned etching process. The spacer 618a is formed on the sidewalls of the second electrode 604, and the sacrificial layer 606 under the material layer 614 is exposed. Finally, the sacrificial layer is removed through the structure release etch process, and a cavity 616 is formed. The material layer 614, the material layer 616 and the spacer 618a are protection layers. While the materials of the material layer 614, the material layer 616 and the spacer 618a are conductor materials, they can also be the conductor parts of the second electrode 605.

The optical interference display cell manufactured through the aforementioned process is illustrated in FIG. 6C. An optical interference display cell 600, which can be a color-changeable pixel unit, comprises a first electrode 602 and a second electrode 605, wherein the first electrode 602 and the second electrode 605 are set approximately in parallel. The first electrode 602 and the second electrode 605 are chosen from the group consisting of narrowband mirrors, broadband mirrors, non-metal mirrors, metal mirrors and any arbitrary combination thereof.

The supporters 612 support the first electrode 602 and the second electrode 605 and a cavity 620 is formed therein. The second electrode 605 comprises the conductor layer 604, the material layer 614 and the material layer 616 and the spacer 618a, wherein the conductor layer 604 is covered by the material layer 614, the material layer 616 and the spacer 618a. The length of the cavity in the conventional optical interference display cell is the thick of the sacrificial layer, and the sacrificial layer is removed through a structure release process and then the cavity 620 is formed. In this embodiment, the material layer 618, the material layer 614 and the spacer 618a of the conductor layer 604 and the side walls can protect the conductor layer 604 of the second electrode 605 in the structure release process from the injury of the etching reagent. Therefore, when choosing the materials for the sacrificial layer and the second electrode, there is no need to restrict the material within the material with high etching selectivity. Hence, the chosen in materials is broader. Besides, the material layer 614, the material layer 618 and the spacer 618a will further protect the conductor layer 604 from the oxidation and etching of the oxygen and the moisture in the air.

The manufacturing method of the optical interference display cell disclosed in the third embodiment has another advantage that only one mask is needed to produce the second electrode. The decrease of one mask not only accelerates the process but also decreases the cost.

The thick of the material layer used to protect the suspended movable microstructure disclosed in the present invention is decided according to the demands. There are also no limits in the thick of the material layer used to protect the suspended movable microstructure in the two embodiments. It depends on the size of the optical interference display cell. Generally speaking, the thick of the material layer in the embodiments of the present invention is about several angstroms to 2000 angstrom, preferably about 200 angstrom to 1000 angstrom.

As is understood by a person skilled in the art, the foregoing embodiments of the present invention are illustrative of the present invention rather than limiting of the present invention. The structure of a micro electro mechanical system and the method for manufacturing the same disclosed in the present invention can be applied in various micro electro mechanical structure systems. It is intended that various modifications and similar arrangements be included within the spirit and scope of the appended claims, the scope of which should be accorded the broadest interpretation so as to encompass all such modifications and similar structure.

What is claimed is:

1. A pre-release structure configured to form a micro electro mechanical system upon removal of a sacrificial layer through a structure release etch process, said micro electro mechanical system suitable to use on an optical interference display cell, the pre-release structure comprising:
   a first electrode;
   a second electrode comprising:
      a first material layer; and
      a conductor layer comprising a light reflective surface facing the first electrode and set directly on the first material layer and approximately in parallel to the first electrode, wherein the first material layer is positioned between the conductor layer and the first electrode;
   a sacrificial layer positioned between the first material layer and the first electrode, the sacrificial layer selected from the group consisting of dielectric material, metal material, and silicon material; and
   a supporter configured to separate the first electrode from the first material layer to form a cavity upon structure release etching;
   wherein the conductor layer is susceptible to etching by an etchant suitable to remove the sacrificial layer and wherein the first material layer is adapted to protect the second electrode from etching when the sacrificial layer is removed using the etchant
   wherein the optical interference display cell formed after removal of the sacrificial layer is configured to interferometrically reflect light entering the cavity and contacting the light reflective surface.

2. The pre-release structure of claim 1, wherein the material of the sacrificial layer is selected from the group consisting of metal material or silicon material.

3. The pre-release structure of claim 1, further comprising a second material layer covering the second electrode.

4. The pre-release structure of claim 3, wherein the material of the second material layer is selected from the group consisting of silicon material, dielectric material, transparent conductor material, macromolecule polymer, metal oxide and any arbitrary combination thereof.

5. The pre-release structure of claim 4, wherein the second material layer is a silicon material that is poly-silicon or amorphous silicon.

6. The pre-release structure of claim 4, wherein the second material layer is a dielectric material that is silicon oxide, silicon nitride, or silicon oxynitride.

7. The pre-release structure of claim 4, wherein the second material layer is a transparent conductor material that is indium tin oxide, indium zinc oxide, or indium oxide.

8. The pre-release structure of claim 3, wherein the thickness of the second material layer is about several angstroms to 2000 angstrom.

9. The pre-release structure of claim 3, wherein the thickness of the second material layer is preferably about 200 angstrom to 1000 angstrom.

10. The pre-release structure of claim 1, wherein the material of the first material layer is selected from the group consisting of silicon material, dielectric material, transparent conductor material, macromolecule polymer, metal oxide and any arbitrary combination thereof.

11. The pre-release structure of claim 10, wherein the first material layer is a silicon material that is poly-silicon or amorphous silicon.

12. The pre-release structure of claim 10, wherein the first material layer is a dielectric material that is silicon oxide, silicon nitride, or silicon oxynitride.

13. The pre-release structure of claim 10, wherein the first material layer is a transparent conductor material that is indium tin oxide, indium zinc oxide, or indium oxide.

14. The pre-release structure of claim 1, wherein the thickness of the first material layer is about several angstroms to 2000 angstrom.

15. The pre-release structure of claim 1, wherein the thickness of the first material layer is preferably about 200 angstrom to 1000 angstrom.

16. The pre-release structure of claim 1, wherein the material forming the supporter is selected from the group consisting of one or more of positive photoresists, negative photoresists, acrylic resins, and epoxy resins.

17. The pre-release structure of claim 1, wherein the material of forming the conductor layer is metal material.

18. The pre-release structure of claim 1, wherein the second electrode is a movable electrode.

19. The pre-release structure of claim 1, wherein the sacrificial layer is amorphous silicon.

20. A structure of a micro electro mechanical system comprising:
a first electrode;
a second electrode comprising:
a first material layer; and
a conductor layer set on the first material layer and approximately in
parallel to the first electrode; and
a supporter configured to separate the first electrode from the first material layer to form a cavity;
a second material layer set on the second electrode; and
a spacer set on the sidewalls of the second electrode and the first material layer;
wherein the first material layer is adapted to protect the second electrode from etching when a sacrificial layer between the first electrode and the first material layer is removed through a structure release etch process to form the cavity.

21. The structure of a micro electro mechanical system of claim 20, wherein the material of the spacer is selected from the group consisting of silicon material, dielectric material, transparent conductor material, macromolecule polymer, metal oxide and any arbitrary combination thereof.

22. The structure of a micro electro mechanical system of claim 21, wherein the material of the spacer is a silicon material that is poly-silicon or amorphous silicon.

23. The structure of a micro electro mechanical system of claim 21, wherein the material of the spacer is a dielectric material that is silicon oxide, silicon nitride, or silicon oxynitride.

24. The structure of a micro electro mechanical system of claim 21, wherein the material of the spacer is a transparent conductor material that is indium tin oxide, indium zinc oxide, or indium oxide.

25. The structure of a micro electro mechanical system of claim 21, wherein the material of the spacer is a macromolecule polymer that is paraffin or a macromolecule material that can be coated by vapor.

26. A structure of a micro electro mechanical system, comprising:
a first electrode;
a second electrode comprising:
a first material layer; and
a conductor layer set on the first material layer and approximately in
parallel to the first electrode; and
a supporter configured to separate the first electrode from the first material layer to form a cavity;
wherein the first material layer is adapted to protect the second electrode from etching when a sacrificial layer between the first electrode and the first material layer is removed through a structure release etch process to form the cavity;
wherein the first material layer is a macromolecule polymer that is paraffin or a macromolecule material that can be coated by vapor.

27. A structure of a micro electro mechanical system, comprising:
a first electrode;
a second electrode comprising:
a first material layer; and
a conductor layer set on the first material layer and approximately in parallel to the first electrode;
a supporter configured to separate the first electrode from the first material layer to form a cavity; and
a second material layer covering the second electrode;

wherein the first material layer is adapted to protect the second electrode from etching when a sacrificial layer between the first electrode and the first material layer is removed through a structure release etch process to form the cavity;
wherein the second material layer is a macromolecule polymer that is paraffin or a macromolecule material that can be coated by vapor.

28. A pre-release structure configured to form a micro electro mechanical system upon removal of a sacrificial layer through a structure release etch process, said micro electro mechanical system suitable to use on an optical interference display cell, the pre-release structure comprising:
a first electrode;
a second electrode comprising a light reflective surface facing the first electrode and set approximately in parallel to the first electrode;
a material layer directly contacting the light reflective surface;
a sacrificial layer positioned between the material layer and the first electrode, the sacrificial layer selected from the group consisting of dielectric material, metal material, and silicon material; and
a supporter configured to separate the first electrode from the material layer to form a cavity upon structure release etching;
wherein the second electrode is susceptible to etching by an etchant suitable to remove the sacrificial layer and wherein the material layer is adapted to protect the second electrode from etching when the sacrificial layer is removed using the etchant
wherein the optical interference display cell formed after removal of the sacrificial layer is configured to interferometrically reflect light entering the cavity and contacting the light reflective surface.

29. The pre-release structure of claim 28, wherein the material of the sacrificial layer is selected from the group consisting of metal material and silicon material.

30. The pre-release structure of claim 28, wherein the material of the material layer is selected from the group consisting of silicon material, dielectric material, transparent conductor material, macromolecule polymer, metal oxide and any arbitrary combination thereof.

31. The pre-release structure of claim 30, wherein the material of the material layer is a silicon material that is poly-silicon or amorphous silicon.

32. The pre-release structure of claim 30, wherein the material of the material layer is a dielectric material that is silicon oxide, silicon nitride, or silicon oxynitride.

33. The pre-release structure of claim 30, wherein the material of the material layer is a transparent conductor material that is indium tin oxide, indium zinc oxide, or indium oxide.

34. The pre-release structure of claim 30, wherein the material of the material layer is a macromolecule polymer that is paraffin or a macromolecule material that can be coated by vapor.

35. The pre-release structure of claim 28, wherein the thickness of the material layer is about several angstroms to 2000 angstrom.

36. The pre-release structure of claim 28, wherein the thickness of the material layer is preferably about 200 angstrom to 1000 angstrom.

37. The pre-release structure of claim 28, wherein the material forming the supporter is selected from the group consisting of one or more of positive photoresists, negative photoresists, acrylic resins, and epoxy resins.

38. The pre-release structure of claim 28, wherein the second electrode is a movable electrode.

39. The pre-release structure of claim 28, wherein the sacrificial layer is amorphous silicon.

* * * * *

UNITED STATES PATENT AND TRADEMARK OFFICE
CERTIFICATE OF CORRECTION

PATENT NO. : 7,291,921 B2
APPLICATION NO. : 10/810660
DATED : November 6, 2007
INVENTOR(S) : Wen-Jian Lin It is certified that error appears in the above-identified patent and that said Letters Patent is hereby corrected as shown below:

On Title Page 5, Col. 1, line 1, Item [56] Under Other Publications, delete "Survace" and insert -- Surface --, therefor.

On Title Page 5, Col. 1, line 2, Item [56] Under Other Publications, delete "Micromachine" and insert -- Micromachined --, therefor.

On Title Page 5, Col. 1, line 4, Item [56] Under Other Publications, delete "Lauderale" and insert -- Lauderdale --, therefor.

On Title Page 5, Col. 1, line 6, Item [56] Under Other Publications, delete "micromachine" and insert -- micromachined --, therefor.

On Title Page 5, Col. 1, line 14, Item [56] Under Other Publications, delete "Quanum" and insert -- Quantum --, therefor.

On Title Page 5, Col. 1, line 34, Item [56] Under Other Publications, delete "XeF2" and insert -- $XeF_2$ --, therefor.

On Title Page 5, Col. 1, line 35, Item [56] Under Other Publications, delete "SiO2" and insert -- $SiO_2$ --, therefor.

On Title Page 5, Col. 2, line 58, Item [56] Under Other Publications, delete "XeF2" and insert -- $XeF_2$ --, therefor.

On Title Page 6, Col. 1, line 4, Item [56] Under Other Publications, delete "Aluminoa" and insert -- Alumina --, therefor.

UNITED STATES PATENT AND TRADEMARK OFFICE
CERTIFICATE OF CORRECTION

| | |
|---|---|
| PATENT NO. | : 7,291,921 B2 |
| APPLICATION NO. | : 10/810660 |
| DATED | : November 6, 2007 |
| INVENTOR(S) | : Wen-Jian Lin |

It is certified that error appears in the above-identified patent and that said Letters Patent is hereby corrected as shown below:

On Title Page 6, Col. 1, line 11, Item [56] Under Other Publications, delete "compatable" and insert -- compatible --, therefor.

On Title Page 6, Col. 1, line 15, Item [56] Under Other Publications, delete "vo" and insert -- vol. --, therefor.

On Title Page 6, Col. 1, line 17, Item [56] Under Other Publications, delete ""Maniature" and insert -- "Miniature --, therefor.

On Title Page 6, Col. 1, line 20, Item [56] Under Other Publications, delete "Internatioal" and insert -- International --, therefor.

On Title Page 6, Col. 1, line 20, Item [56] Under Other Publications, delete "Andactuators," and insert -- And Actuators, --, therefor.

On Title Page 6, Col. 1, line 21, Item [56] Under Other Publications, delete "Youk" and insert -- York --, therefor.

On Title Page 6, Col. 1, line 26, Item [56] Under Other Publications, delete "Review," and insert -- Review: --, therefor.

On Title Page 6, Col. 2, line 18, Item [56] Under Other Publications, delete "microelectomechanical systesm" and insert -- microelectromechanical systems --, therefor.

UNITED STATES PATENT AND TRADEMARK OFFICE
CERTIFICATE OF CORRECTION

| | |
|---|---|
| PATENT NO. | : 7,291,921 B2 |
| APPLICATION NO. | : 10/810660 |
| DATED | : November 6, 2007 |
| INVENTOR(S) | : Wen-Jian Lin |

It is certified that error appears in the above-identified patent and that said Letters Patent is hereby corrected as shown below:

On Title Page 6, Col. 2, line 19, Item [56] Under Other Publications, delete "Comparision" and insert -- Comparison --, therefor.

On Title Page 6, Col. 2, line 26, Item [56] Under Other Publications, delete "Production" and insert -- Product --, therefor.

Signed and Sealed this

Thirtieth Day of June, 2009

JOHN DOLL
*Acting Director of the United States Patent and Trademark Office*

UNITED STATES PATENT AND TRADEMARK OFFICE
CERTIFICATE OF CORRECTION

PATENT NO.        : 7,291,921 B2                                      Page 1 of 1
APPLICATION NO.   : 10/810660
DATED             : November 6, 2007
INVENTOR(S)       : Wen-Jian Lin It is certified that error appears in the above-identified patent and that said Letters Patent is hereby corrected as shown below:

In col. 9, line 61, in claim 1, after "layer" insert -- directly contacting the first material layer and --.

In col. 12, line 21, in claim 28, after "layer" insert -- directly contacting the material layer and --.

Signed and Sealed this

Seventh Day of July, 2009

JOHN DOLL
*Acting Director of the United States Patent and Trademark Office*